(12) United States Patent
Kinge et al.

(10) Patent No.: US 11,551,928 B2
(45) Date of Patent: Jan. 10, 2023

(54) SOLUTION-BASED DEPOSITION METHOD FOR PREPARING SEMICONDUCTING THIN FILMS VIA DISPERSED PARTICLE SELF-ASSEMBLY AT A LIQUID-LIQUID INTERFACE

(71) Applicant: TOYOTA MOTOR EUROPE, Brussels (BE)

(72) Inventors: Sachin Kinge, Brussels (BE); Hannah Johnson, Brussels (BE); Kevin Sivula, Lausanne (CH); Rebekah Anne Wells, Lausanne (CH)

(73) Assignee: TOYOTA MOTOR EUROPE, Brussels (BE)

( * ) Notice: Subject to any disclaimer, the term of this patent is extended or adjusted under 35 U.S.C. 154(b) by 0 days.

(21) Appl. No.: 17/265,420

(22) PCT Filed: Aug. 3, 2018

(86) PCT No.: PCT/EP2018/071174
§ 371 (c)(1),
(2) Date: Feb. 2, 2021

(87) PCT Pub. No.: WO2020/025146
PCT Pub. Date: Feb. 6, 2020

(65) Prior Publication Data
US 2021/0313177 A1 Oct. 7, 2021

(51) Int. Cl.
*B05D 1/20* (2006.01)
*H01L 21/02* (2006.01)
(Continued)

(52) U.S. Cl.
CPC ........ *H01L 21/02568* (2013.01); *B05D 1/202* (2013.01); *H01L 21/02601* (2013.01);
(Continued)

(58) Field of Classification Search
None
See application file for complete search history.

(56) References Cited

FOREIGN PATENT DOCUMENTS

| EP | 0 382 339 A1 | 8/1990 |
| WO | 2016/094384 A2 | 6/2016 |

(Continued)

OTHER PUBLICATIONS

Yu et al.; "Self-assembled 2D WSe2 thin films for photoelectrochemical hydrogen production;" Nature Communications; 2015; pp. 1-8; vol. 8596.

(Continued)

*Primary Examiner* — Tabatha L Penny
(74) *Attorney, Agent, or Firm* — Oliff PLC

(57) ABSTRACT

A method for preparing a semiconducting thin film and device for carrying out the method, wherein the method includes: (1) providing a liquid-liquid interface; (2) providing at least one layered semiconductor material or its precursor(s) in the form of particles in a solvent in the form of a dispersion; (3) injecting the dispersion at the liquid-liquid interface, in order to obtain an assembly of semiconductor/semiconductor precursor particles; (4) bringing the assembly of into contact with a flexible substrate; and (5) applying a surface pressure to the dispersion to obtain a particle film of semiconductor/semiconductor precursor on the substrate, wherein the first solvent has a higher density than the second solvent.

14 Claims, 4 Drawing Sheets

(51) Int. Cl.
    *B22F 7/04*           (2006.01)
    *B82Y 30/00*         (2011.01)
    *B82Y 40/00*         (2011.01)

(52) U.S. Cl.
    CPC .. *H01L 21/02628* (2013.01); *B22F 2007/042* (2013.01); *B82Y 30/00* (2013.01); *B82Y 40/00* (2013.01)

(56) References Cited

FOREIGN PATENT DOCUMENTS

| | | | | |
|---|---|---|---|---|
| WO | WO-2016094384 A2 | * | 6/2016 | ............ B05D 1/202 |
| WO | 2017/219125 A1 | | 12/2017 | |
| WO | WO-2017219125 A1 | * | 12/2017 | ............ B05D 1/204 |

OTHER PUBLICATIONS

Biswas et al.; "A Novel Approach to Create a Highly Ordered Monolayer Film of Graphene Nanosheets at the Liquid-Liquid Interface;" Nano Letters; 2009; pp. 167-172; vol. 9, No. 1.

Parchine et al.; "Large Area 2D and 3D Colloidal Photonic Crystals Fabricated by a Roll-to-Roll Langmuir-Blodgett Method;" Langmuir; 2016; pp. 5862-5869; vol. 32.

Zhang et al.; "Langmuir films and uniform, large area, transparent coatings of chemically exfoliated MoS2 single layers;" Journal of Materials Chemistry C; 2017; pp. 11275-11287; vol. 5.

Lim et al.; Roll-to-Roll Production of Layer Controlled Molybdenum Disulfide: A Platform for 2D Semiconductor-Based Industrial Applications; Adv. Mater. 2017; pp. 1-8.

Shen et al.; Liquid Phase Exfoliation of Two-Dimensional Materials by Directly Probing and Matching Surface Tension Components; Nano Letters; 2015; pp. 5449-5454; vol. 15.

Bhattacharjee; "DLS and zeta potential—What they are and what they are not?" Journal of Controlled Release 2016; pp. 337-351; vol. 235.

Miremadi et al.; "New structures from exfoliated MoS2;" Journal of Applied Physics; 1991; pp. 6373-6379; vol. 69, No. 1.

Yu et al.; "Hybrid Heterojunctions of Solution-Processed Semiconducting 2D Transition Metal Dichalcogenides;" ACS Energy Letters; 2017; pp. 524-531; vol. 2.

May 14, 2019 Search Report issued in International Patent Application No. PCT/EP2018/071174.

* cited by examiner

SOLUTION-BASED DEPOSITION METHOD FOR PREPARING SEMICONDUCTING THIN FILMS VIA DISPERSED PARTICLE SELF-ASSEMBLY AT A LIQUID-LIQUID INTERFACE

FIELD OF INVENTION

The present application concerns the fields of electronics, optoelectronics, gas sensing, electrochemistry, catalysis and energy conversion and storage.

BACKGROUND ART

One of the most demanding challenges in material science today is to develop new materials having the properties which suit specific applications.

In the technical field of optoelectronic devices, gas sensors and energy conversion/storage devices, layered transition metal dichalcogenides (TMDs), such as $MoS_2$, $WS_2$, $MoSe_2$ and $WSe_2$, have been identified as promising semiconducting 2D layered materials, since they exhibit particular electrical, optical and mechanical properties. In order to fully make use of these properties, research has been performed to obtain thin films of these materials.

A Langmuir-Blodgett method allows the fabrication of ultra-thin, highly ordered organic films. In principle, the basic idea of this method consists in dipping and pulling a solid substrate.

In this well-known method, a molecule dissolved in a non-porous volatile solvent is spread onto the surface of a polar solvent (sub phase), which leads to a formation of a one-molecule-thick layer (Langmuir monolayer), after the evaporation of the non-polar volatile solvent and application of surface pressure. Then the thus-formed film is deposited on a substrate by different methods, such as Langmuir-Blogett vertical method, Langmuir-Shaefer method, horizontal precipitation method, and a roll-to-roll deposition method.

Here, processing liquid-phase exfoliated 2D flakes into a thin film in a continuous manner while avoiding restacking and aggregation of the flakes has remained a major technical challenge. Although on a laboratory scale, restacking can be avoided by self-assembly of the 2D nano-flakes at a liquid-liquid interface of two non-solvents for the flakes (Yu et al. [1] and Biswas et. al [2]), the ability to perform this liquid-liquid self-assembly and the subsequent flake deposition has remained a challenge at an industrial scale.

To date, [3], [4] and [5] disclose roll-to-roll Langmuir-Blodgett printing methods with a liquid-gas interface. However, these methods require high temperature conditions and/or chemical etching, and can not be conducted under ambient conditions.

Therefore the present invention aims at providing a method for preparing a semiconducting thin film, wherein the liquid-liquid self-assembly and the subsequent flake deposition is carried out in an efficient manner, in ambient conditions.

NON-PATENT LITERATURE REFERENCES

[1] X. Yu: Nat. Commun. 2015, 6, 7596: Self-assembled 2D $WSe_2$ thin films for photoelectrochemical hydrogen production

[2] S. Biswas: Nano Lett., 2009, 9, 167: A Novel Approach to Create a Highly Ordered Monolayer Film of Graphene Nanosheets at the Liquid-Liquid Interface

[3] M. Parchine, J. McGrath, M. Bardosova and M. E. Pemble: Langmuir, Vol. 32 (23), p. 5862-5869: Large area 2D and 3D colloidal photonic crystals fabricated by a roll-to-roll Langmuir-Blodgett method

[4] Y. Zhang et al.: J. Mater. Chem. C, 2017, 5, 11275: Langmuir films and uniform, large area, transparent coatings of chemically exfoliated $MoS_2$ single layers

[5] Y. R. Lim: Adv. Mater., 2017, 1705270: Roll-to-Roll Production of Layer-Controlled Molybdenum Disulfide: A Platform for 2D Semiconductor-Based Industrial Applications

SUMMARY OF THE INVENTION

The present invention relates to a method for preparing a semiconducting thin film comprising the following steps:
(1) providing a liquid-liquid interface of a first solvent and a second solvent, wherein the first solvent is polar, and the second solvent is non-polar;
(2) providing at least one layered semiconductor material or its precursor(s) in the form of particles in a third solvent in the form of a dispersion;
(3) injecting the dispersion of step (2) at the liquid-liquid interface obtained in step (1), in order to obtain an assembly of semiconductor/semiconductor precursor particles at the liquid-liquid interface;
(4) bringing the assembly of semiconductor/semiconductor precursor particles at the liquid-liquid interface obtained in step (3) into contact with a flexible substrate; and
(5) applying a surface pressure to the dispersion obtained in step (4), in order to obtain a particle film of semiconductor/semiconductor precursor on the substrate, wherein the first solvent has a higher density than the second solvent;
wherein the first solvent and the second solvent are immiscible with each other and their densities are different by at least 0.01 g/mL; and
wherein the third solvent is miscible at least with one of the first solvent or the second solvent.

DETAILED DESCRIPTION OF THE INVENTION

Definition

Figure 1:
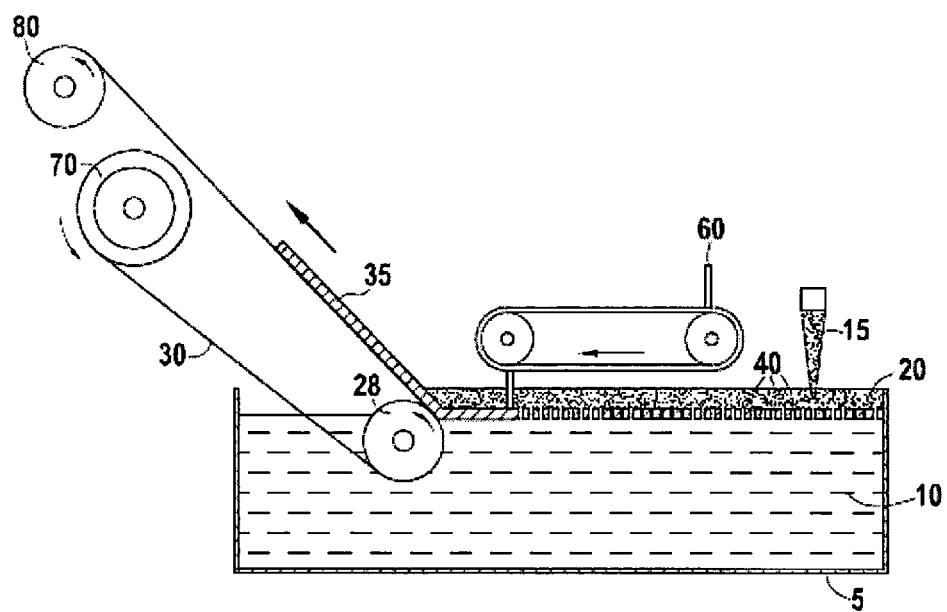
FIG. 1 is a schematic representation of a roll-to-roll device for one embodiment of the present invention.
Figure 2:
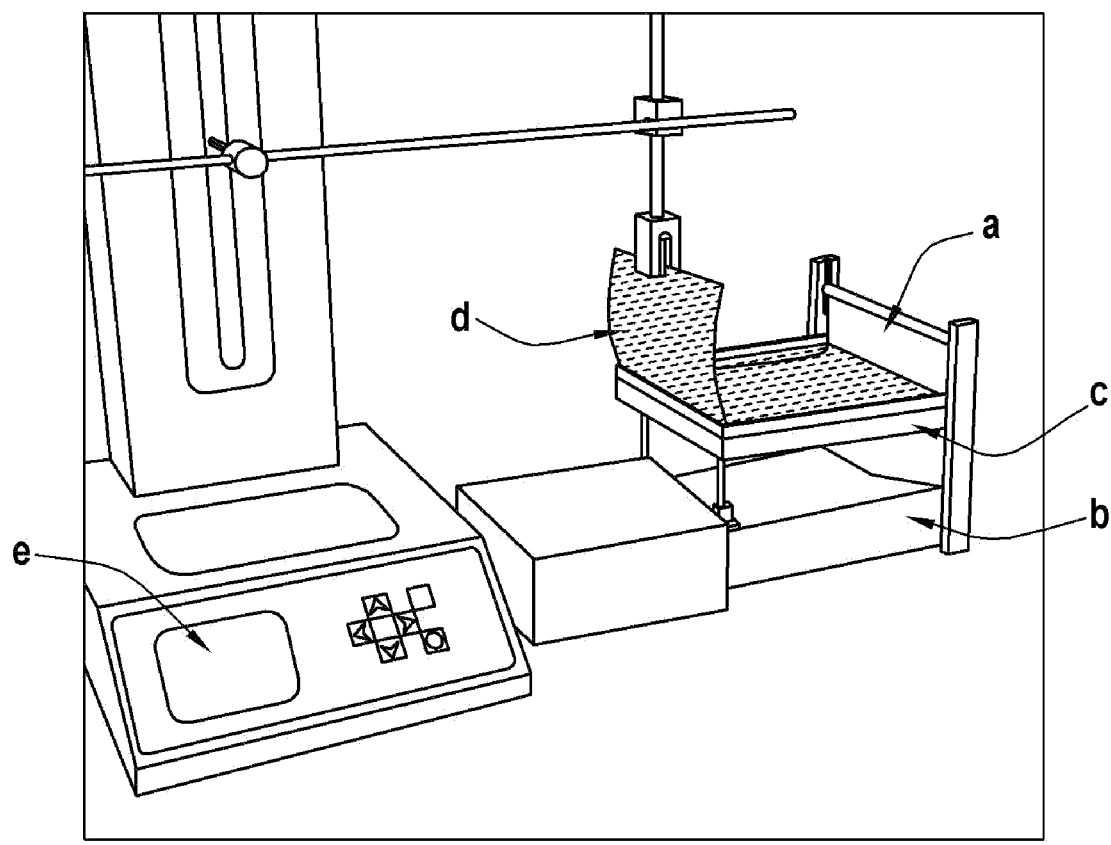
FIG. 2 illustrates a roll-to-roll device which can be used in the method of the present invention: (a) mechanical film compression paddle; (b) computer-controlled actuator; (c) bath; and (d) flexible substrate.

The term "polar", as used herein, refers to "having a large dipolar moment". A polar solvent can have a dielectric constant of, for example, 10 or more. Examples of polar solvents are water, carboxylic acids such as acetic acid, alcohols such as methanol, ethanol, n-propanol or n-butanol, ketones such as acetone, organic sulfoxides such as dimethyl sulfoxide, organic nitriles such as acetonitrile and amides such as dimethylformamide.

The term "non-polar", as used herein, refers to "having a small dipolar moment". A non-polar solvent can have a dielectric constant of, for example 10 or less. Examples of non-polar solvents are linear or cyclic hydrocarbons such as benzene or hexane, ethers such as diethyl ether, halogenated hydrocarbons such as carbon tetrachloride and methylene chloride.

The term "miscible", as used herein, refers to two or more solvents which, when mixed together, form one sole phase. In the case of two liquids, they may typically be miscible when the solubility of one solvent in the other is 10 g/100 g or more.

The term "immiscible", as used herein, refers to two or more solvents which, when mixed together, form two or more phases. In case of two liquids, they may typically be miscible when the solubility of one solvent in the other is less than 10 g/100 g.

The term "flexible" as used herein, refers to the feature that a substrate can be deformed. A flexible substrate, as used herein, may have a bend radius of 5 cm or less.

Method for Preparing a Semiconducting Thin Film

The method for preparing a semiconducting thin film of the present invention comprises the following steps:
(1) providing a liquid-liquid interface of a first solvent and a second solvent, wherein the first solvent is polar and the second solvent is non-polar;
(2) providing at least one layered semiconductor material or its precursor(s) in the form of particles in a third solvent in the form of a dispersion;
(3) injecting the dispersion of step (2) at the liquid-liquid interface obtained in step (1), in order to obtain an assembly of semiconductor/semiconductor precursor particles at the liquid-liquid interface;
(4) bringing the assembly of semiconductor/semiconductor precursor particles at the liquid-liquid interface obtained in step (3) into contact with a flexible substrate; and
(5) applying a surface pressure to the dispersion obtained in step (4), in order to obtain a particle film of semiconductor/semiconductor precursor on the substrate,
wherein the first solvent has a higher density than the second solvent;
wherein the first solvent and the second solvent are immiscible with each other and their densities are different by at least 0.01 g/mL; and
wherein the third solvent is miscible with at least one of the first solvent or the second solvent.

Starting Materials

Layered Semiconductor Material

The layered semiconducting material can be, for example, C (graphene), P (phosporene), h-BN (hexagonal boron nitride), InSe, GaSe, GaS, GaTe GeAs, SiAs, InSe, $Bi_2Se_3$, $SnS_2$, $MoS_2$, $WS_2$, $MoSe_2$, $WSe_2$, $WTe_2$ and $MoTe_2$.

Preferably, the layered semiconducting material can be a transition metal dichalcogenide, for example, $MoS_2$, $WS_2$, $MoSe_2$, $WSe_2$ and $MoTe_2$.

Precursors of layered semiconductor material can be metal oxides, such as $MoO_3$, $WO_3$, $SnO_2$, $Ga_2O_3$, metal fluorides, organometallics, catalytic metals, polymers such as polyethylene, polymethyl methacrylate (PMMA), polypropylene (PP), polystyrene (PS), polyvinyl chloride (PVC), polyvinylalcool (PVA), pure metals such as Mo, W, Si, Ge, metal nitrides such as GaN, WN, MoN.

Preferred precursors of layered semiconductor material are metal oxides, such as $MoO_3$, $WO_3$, and pure metals such as W and Mo.

Preparation of Layered Semiconductor Material

The layered semiconductor material used in the present invention can be prepared, for example, by a mechanical exfoliation method, a liquid exfoliation method, or a chemical exfoliation method of the bulk starting material. Alternatively, a sulfurization of metal (or metal oxide) thin film, vaporization of metal oxide with chalcogenide precursor can also be used.

Preferably, the layered semiconductor material used in the present invention is prepared by a mechanical exfoliation method or a liquid exfoliation method.

The first solvent and the second solvent are selected in such a way that they both will not disperse the particles of layered semiconductor materials to be deposited.

Particles Size and Shape

The layered semiconductor material may be in the form of particles of one to several atomic layers, having a thickness of 0.5 nm or more and 100 nm or less, preferably 1 nm or more and 10 nm or less, and more preferably 5 nm or more and 10 nm or less, and a diameter in a direction perpendicular to the thickness of 20 nm or more and 10 µm or less, preferably 200 nm or more and 1 µm or less.

In a preferred embodiment, particles may be nanoflakes wherein the thickness is significantly smaller than the diameter in a direction perpendicular to the thickness.

Most preferably, the particles (or the nanoflakes) have a thickness of 1 nm or more and 10 nm or less, with a significantly larger diameter in a direction perpendicular to the thickness direction of 20 nm or more and 10 µm or less, more preferably of 200 nm or more and 1 µm or less.

First Solvent

The first solvent, which is polar, has a higher density than the second solvent, which is non-polar, and the first solvent is immiscible with the second solvent, which is non-polar. Therefore when a first solvent and a second solvent are put in contact, an interface between the first solvent and the second solvent can be obtained, the first solvent being under the second polar solvent, because of the difference in density.

The density of the first solvent can be, for example, 0.8 g/mL or more and 2.0 g/mL or less.

The first solvent has a density higher than that of the second solvent by at least 0.01 g/mL, preferably by 0.05 g/mL and more preferably by 0.1 g/mL.

The dielectric constant of the first solvent can be, for example, 10 or more.

The first solvent can be, for example, water, a carboxylic acid such as acetic acid, an alcohol such as ethylene glycol, methanol, ethanol, n-propanol or n-butanol, a ketone such as acetone, an acetate such as ethyl acetate, an organic sulfoxide such as dimethyl sulfoxide, an organic nitrile such as acetonitrile and an amide such as dimethylformamide (DMF) or dimethylsulfoxide (DMSO) or a mixture thereof.

Preferably, the first solvent is water, ethylene glycol, acetonitrile, or mixtures thereof at any proportion.

Second Solvent

The second solvent, which is non-polar, has a lower density than the first solvent, which is polar, and the second solvent is immiscible with the first solvent. Therefore when a first solvent and a second solvent are put in contact, an interface between the first solvent and the second solvent can be obtained, the second solvent being over the first solvent, because of the difference in density.

The density of the second solvent can be, for example, 1.2 g/mL or more and 0.5 g/mL or less.

The second solvent has a density lower than that of the first solvent by at least 0.01 g/mL, preferably by 0.05 g/mL and more preferably by 0.1 g/mL The dielectric constant of the second solvent can be, for example, 10 or less.

The second solvent can be, for example, a linear or cyclic hydrocarbon such as, pentane, hexane, heptane, octane or benzene, an ether such as diethyl ether, or a mixture thereof.

Preferably second solvent is a C5-C8 alkane.

More preferably, the second solvent is hexane or heptane, which has a low boiling point and therefore is easy to remove.

Third Solvent

The layered semiconductor material is dispersed in a third solvent.

The third solvent is soluble/miscible at least in one of the first solvent or the second solvent.

The third solvent has a density of 0.5 g/mL or more and 2.0 g/mL or less.

The third solvent has a dielectric constant of 0 or more and 100 or less.

The third solvent can be, for example, C4-C8 amines or alcohols such as hexylamine, butanol, hexanol, isopropanol (IPA) or a mixture thereof.

Advantageously, a more stable dispersion of particles can be prepared with a third solvent having a more similar surface energy as that of the particles.

The surface energy can be measured, for example, by using a contact angle measurement. This method is detailed for example in Nano Lett., 2015, 15 (8), pp 5449-5454, DOI: 10.1021/acs.nanolett.5b01842.

Some advantageous combinations of third solvent and particles satisfying the above condition are, for example, (third solvent, particle)=(1:1 IPA/water, graphene), (1:1 IPA/water, $WS_2$), (1:1 IPA/water, h-BN), (1:1 IPA/water, $MoSe_2$), (1:4 IPA/water, $Bi_2Se_3$), (1:4 IPA/water, $SnS_2$), (7:3 IPA/water, $MoS_2$), and (acetonitrile, $TaS_2$).

Advantageously, a more stable dispersion of particles can be prepared with a third solvent having an ionic strength closer to the pZC (point of zero charge) of the particles.

pZC can be estimated, for example, by using a Dynamic Light Scattering apparatus. This device is detailed, for example in J. Control. Release, 235 (2016) 337-351.

pZC can be adjusted by changing the pH. For example, the pZC is about pH=2-3 for $MoS_2$, and pZC is close to pH=1 for $WS_2$ (J. Appl. Phys. 69, 6373 (1991)).

The pH can be adjusted by adding an acid or a base. Examples of acid are HCl, $H_2SO_4$ and and acetic acid. Examples of base are NaOH, ammonium hydroxide and methyl amine.

Preferably, the third solvent is hexylamine ($CH_3(CH_2)_4CH_2$—$NH_2$), hexanol ($CH_3(CH_2)_4CH_2$—OH), tert-butanol, IPA, water, acetonitrile or a mixture thereof.

Combination of the Solvents

The first solvent and the second solvent are immiscible with each other and the first solvent has a higher density than the second solvent.

The third solvent is miscible with at least one the first solvent and the second solvent.

Possible combinations of a first solvent, a second solvent and a third solvent, can be, for example, (first solvent, second solvent, third solvent)=(ethylene glycol, hexane, hexylamine), (mixture of water and acetonitrile, pentane, tert-butanol), (water, heptane, n-butanol).

Preferable combinations of a first solvent, a second solvent and a third solvent are (first solvent, second solvent, third solvent)=(water, heptane, n-butanol).

Flexible Substrate

The substrate on which a semiconducting thin film is deposited is not particularly limited, as long as it is flexible.

The flexible substrate used in the method of the present invention may have a bend radius of 5 cm or less.

The flexible substrate used in the method of the present invention can be, for example, polyethylene terephthalate (PET), polyethylene (PE), polyvinyl chloride (PVC), polypropylene (PP), polystyrene (PS), polylactic acid (PLA), polycarbonate (PC), acrylic (PMMA) and flexible glass (such as Willow glass commercialized by Corning). These substrate materials shall advantageously not be etched, dissolved or otherwise damaged by the solvents employed under standard conditions.

The flexible substrate used in the method of the present invention can have a thickness of 0.001 mm to 10 mm.

The flexible substrate used in the method of the present invention is preferably electronically conductive for the intended use in semiconductor devices. The flexible substrate is also preferably transparent or semitransparent to visible and near infra-red (NIR) irradiation, for the intended application.

A preferred flexible substrate is indium tin oxide (ITO) or fluorine-doped tin oxide (FTO)-coated polyethyleneterephthalate (PET).

Method Steps

Step (1): Interface of a First Solvent and a Second Solvent

Step (1) of the present method consists in providing a liquid-liquid interface of a first solvent and a second solvent.

This step can be carried out, for example, by first pouring a first solvent and then pouring a second solvent into a container. The solvents could also be added from any point on the wall or bottom of the container through a supply tube.

The volume ratio between a first solvent and a second solvent can be, for example, any ratio of (first solvent volume):(second solvent volume)=10000:1 or more and 1:10000, or less, preferably 1000:1 or more and 1:1000, or less, more preferably 100:1 or more and 1:100, or less, still more preferably 10:1 or more and 1:10 or less and most preferably about 5:1 or more and 1:5 or less.

Step (1) can be carried out at room temperature, or at any combination of temperature and pressure wherein the solvents are in a liquid state.

Step (1) can be carried out in a trough of a width equal to the width of the substrate to be deposited on and composed of materials that will not be etched, dissolved or otherwise damaged by the solvents employed under standard conditions (i.e. 20° C. and 1 atm).

Step (1) can be carried out after step (2).

Step (2): Dispersion of Layered Semiconductor Material or its Precursor(s)

Step (2) of the present method consists in providing at least one layered semiconductor material or its precursor(s) particles in a third solvent in the form of a dispersion.

This step can be carried out, for example, by mixing layered semiconductor material or its precursor(s) with a third solvent.

The amount of layered semiconductor material or its precursor(s) by weight with respect to the volume of the third solvent can be, for example 0.001 mg/mL or more and 1000 mg/mL or less and preferably 0.01 mg/mL or more and 100 mg/mL or less, more preferably, 0.1 mg/mL or more and 10 mL or less and most preferably about 10 mg/mL.

Step (2) can be carried out at room temperature or at any combination of temperature and pressure wherein the solvents are in liquid state, i.e. under a given pressure, any temperature between the boiling point of the solvent having the lowest boiling point among all the solvents used, and the melting point of the solvent having the highest melting point among all the solvents used.

Step (2) can be carried out after step (1). The dispersion may have a viscosity of 0.1 cp or more and 10 cp or less.

Step (3): Injection of the Dispersion at the Liquid-Liquid Interface

Step (3) of the present method consists in injecting the dispersion of step (2) at the liquid-liquid interface obtained in step (1), in order to obtain an assembly of semiconductor/semiconductor precursor particles at the liquid-liquid interface.

This step can be carried out, for example by injecting continuously, or in sequential pulses by a pipette or syringe needle at one or more points in proximity to the liquid-liquid junction.

The injection speed can be, for example, 0.01 mL/min per square cm of liquid-liquid interfacial area or more and 100 mL/min per square cm of liquid-liquid interfacial area or less.

Preferably, the injection speed is 0.01 mL/min per square cm of liquid-liquid interfacial area or more and 1.0 mL/min per square cm of liquid-liquid interfacial area or less.

Most preferably, the injection speed is about 0.025 mL/min per square cm of liquid-liquid interface area.

It is believed that the thickness of the injected dispersion corresponds at least to the thickness of particles, and preferably of nanoflakes, and can be, for example, 0.5 nm or more and 20 nm or less.

Preferably, the thickness of the injected dispersion is 1 nm or more and 10 nm or less.

The injection can be carried out either from above or from below the interface of the liquid-liquid interface obtained in step (1).

Step (3) can be carried out at room temperature, or at any combination of temperature and pressure wherein the solvents are in a liquid state.

Step (4): Contact with a Flexible Substrate

Step (4) of the present method consists in bringing the assembly of semiconductor/semiconductor precursor particles at the liquid-liquid interface obtained in step (3) into contact with a flexible substrate.

This step can be carried out, for example, by a device as disclosed below.

Step (4) can be carried out at room temperature or at any combination of temperature and pressure wherein the solvents are in a liquid state.

Step (5): Deposition Rate

Step (5) of the present method consists in applying a surface pressure to the dispersion obtained in step (4), in order to obtain a flake film of semiconductor/semiconductor precursor on the substrate.

This step can be carried out, for example, by a vertical method, Langmuir-Schafer method, a roll-to-roll deposition method.

Preferably, this method is carried out by a roll-to-roll deposition method, since this is suitable for continuous film production.

More preferably, this step is carried out with the device as disclosed below.

The surface pressure can be controlled, for example, by using a predetermined range of deposition rate.

For example, a deposition rate of 1 mm/min or more and 1000 mm/min or less can be used in step (5).

Preferably, the deposition rate in step (5) is 10 mm/min or more and 100 mm/min or less.

More preferably, the deposition rate in step (5) is 40 mm/min or more and 80 mm/min or less.

Most preferably, the deposition rate in step (5) is about 60 mm/min.

Most preferably, a deposition rate of about 60 mm/min or less can be used in step (5).

Step (5) can be carried out at room temperature or at any combination of temperature and pressure wherein the solvents are in a liquid state.

The thickness of the obtained film can be, for example, 0.5 nm or more and 1000 nm or less.

Preferably, the thickness of the obtained film is 1.0 nm or more and 100 nm or less.

Preferably, the thickness of the obtained film is 1 nm or more and 10 nm or less.

Order of the Steps

The order for carrying out step (1) and step (2) is not particularly limited, i.e. step (1) can be carried out first, and then step (2) is carried out, step (2) can be carried out first, and then step (1) is carried out, or steps (1) and (2) can be carried out simultaneously.

Steps (5) and (6) can also be carried out simultaneously.

In one embodiment, steps (1) to (5) are carried out in the order of the number of steps, i.e. first, step (1), then step (2), step (3), step (4), and finally step (5).

Device for Carrying Out the Method

FIG. 1 shows an exemplary configuration for carrying out the methods described according to the present disclosure.

The system may include a container 5, an injector 15, a roller 25, a paddle belt 60, among others.

Container 5 may be configured to contain a first 10 and second solvent 20, as well as to receive injections of particles 40 from injector 15. By dispensing the first and second solvent into container 5, a liquid-liquid interface may be formed at a particular level within container 5 between first solvent 10 and second solvent 20. Container 5 may, therefore, the fabricated from any suitable material, for example, material having minimal or no reactivity or propensity to react with first 10 and second solvents 20. For example such materials may include, Acetal (Delrin®), Aluminum, Brass, Bronze, Buna N (Nitrile), Carbon graphite, Carbon Steel, Glass, Carpenter 20, Cast iron, Ceramic, Copper, CPVC, EPDM, Epoxy, Fluorocarbon (FKM), Hastelloy-C®, Hypalon®, Hytrel®, Kalrez, Kel-F®, Natural rubber, Neoprene, NORYL®, Nylon, Polyetherether Ketone (PEEK), Polypropylene, PPS (Ryton®), PTFE, PVC, PVDF (Kynar®), stainless steel-304, stainless steel-316, Titanium, Tygon® and Viton®.

Injector 15 may comprise any suitable device configured to introduce a predetermined volume, depending on the surface area of the liquid-liquid interface (e.g. 2-3 ml for a surface area of 100 cm$^2$) of the dispersion into container 5, and particularly at liquid-liquid interface formed at the interface of the first 10 and second solvent 20. Examples of suitable injectors 15 can be found commercially at www.vwr.com (pipette tip or syringe needle).

Injector 15 may be configured to inject or otherwise introduce the predetermined volume of the dispersion at a predefined interval. For example, injector 15 may be configured to introduce the predetermined volume at an interval of 0.1 to 100 seconds. Alternatively, injector 15 may be configured to perform continuous injection of the dispersion at a desired flow rate, e.g., 0.5 mL/s per 20 cm$^2$ of liquid/liquid surface area.

Roller 25 may be configured to support a substrate in motion and onto which semiconductor particles are to be deposited at a predetermined rate. Roller 25 may be positioned at least partially submerged in the first solvent, i.e., the solvent of greater density among the first and second solvent, and may be configured to enable substrate 30 to move at a desired feed rate, for example, 0.1 to 1000 mm/min. Roller 25 may comprise any suitable material for supporting substrate 30, for example, a polymer surrounding a metallic or composite based hub may be provided.

A position of roller 25 may be configured to vary according to a level of the first solvent within container 5 such that roller 25 may maintain a desired level of submersion within the first solvent. For example, roller 25 may be provided with a floating member (not shown), such a floating member being positioned in relation to roller 25 such that roller 25 maintains its position relative to the liquid-liquid interface between the first and second solvents. In so doing, substrate 30 may be passed through both first solvent 10 and second solvent 20, such that particles 40 are distributed on a face of substrate 30 at a desired rate.

One of skill will recognize that other configurations for supporting substrate 30 may be used in lieu of roller 25. For example, a fixed plate having a desired angle relative to the liquid-liquid interface, and a friction-reducing coating with regard to substrate 30 may be provided.

Paddle belt 65 forms an exemplary compression means configured to reduce a distance between particles of semiconductor present in the dispersion at the liquid-liquid interface before and/or during application to substrate 30. According to embodiments of the disclosure, paddle belt 60 may comprise one or more paddles 60 configured to revolve about a set of rollers in a direction causing a flow in the second 20 and/or first solvents 10 so as to exert a pressing force on particles 40 in the dispersion in a direction toward substrate 30. Paddles 60 may comprise any suitable material, for example, an elastic polymer such as polytetrafluoroethylene (PTFE).

Each paddle 60 may therefore span a width of container 5, and may move a suitable velocity for creating a desired level of compaction between the particles 40 of the dispersion, such that upon reaching substrate 30, the particles 40 are aligned and compressed to a desired density upon the surface of substrate 30. In other words, a period between the revolving paddles 60, based on a velocity of the paddles 60 and the spacing therebetween, may be approximately equal to a desired length of a finished semiconductor thin-film segment having a desired particle dispersion per unit area (e.g., $10^{11}$-$10^{14}$ particles per m$^2$).

In addition to the features mentioned above, the system may include a take up roller 80 and a substrate supply roller 70. Take up roller 80 may be configured to exert a force on substrate 30 to draw substrate 30 away from the liquid-liquid interface at a desired, controlled rate. For example, take up roller 80 may include a motor configured to rotate take up roller 80 at a desired rate, resulting in rolling of substrate 30 upon itself at take up roller 80.

Supply roller 70 may be configured to support a supply of substrate 30, and to allow substrate 30 to be extracted from the supply a controlled rate, e.g., based on a rate of rotation of take up roller 80. One of skill in the art understands that any suitable support for supplying the substrate 30 may be implemented.

INDUSTRIAL APPLICATION

The semiconducting thin film obtainable by the present method can be used in the technical field of electronics, optoelectronics, gas sensing, electrochemistry, catalysis, and energy conversion and storage.

More precisely the thin film obtainable by the present method can be used in non-linear optical devices, sensors, command surfaces, molecular electronics, directional electron transfer, conductors, diodes, optical devices, pyroelectronic devices, rectifier, metal-insulator-semiconductor (MIS), single molecule detection (SMD), acoustics surface wave devices, solar energy conversion, light emitting diodes.

The thin film obtainable by the present method can be used, in particular in, large area flexible solar cell, light emitting diode (LED) and solar fuel devices.

EXAMPLES

Example 1

Preparation

Figure 3:
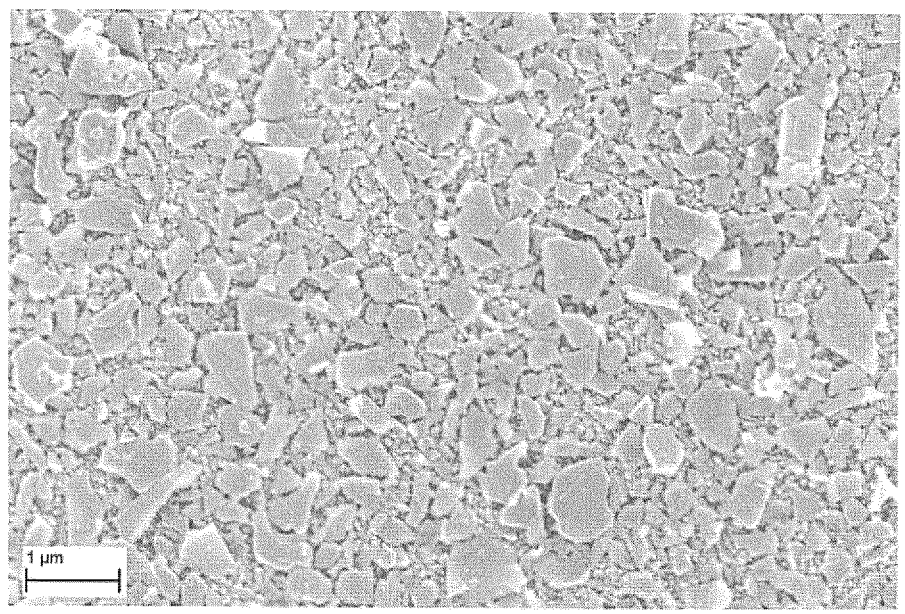
FIG. 3 is a scanning electron microscope (SEM) image of nanoflake $MoS_2$ deposited on fluorine-doped tin oxide (FTO) substrate.
Figure 4:
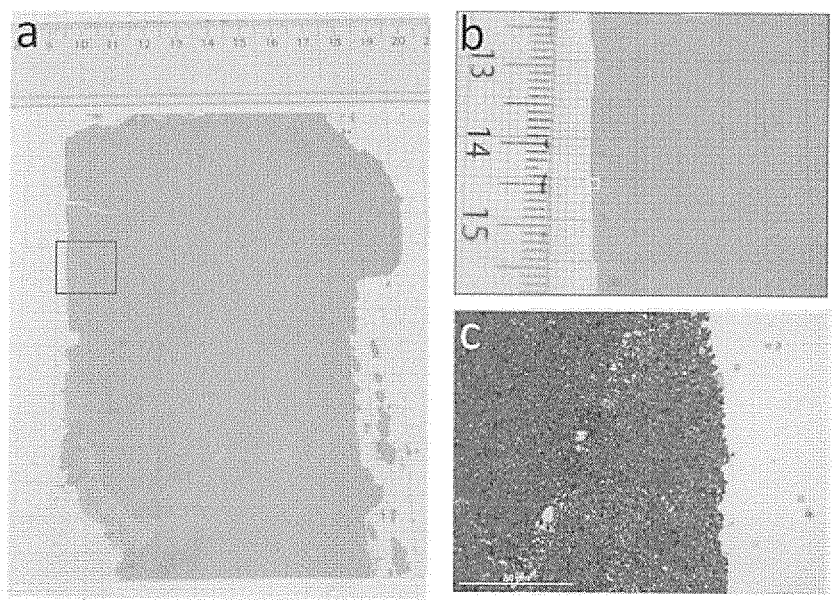
FIG. 4 is an optical imaging of the large-area film: (a) shows the transparency of the film on a piece of graph paper, (b) shows a zoomed photograph of (a), and (c) shows an optical microscope image of the film.

The SEM image of FIG. 3 was obtained by depositing a film of 2D semiconductor nanoflakes of $MoS_2$ on a FTO-coated substrate and then imaging this substrate in a SEM microscope from the top-down.

Starting Materials

The following starting materials were used:
$MoS_2$: Alfa Aesar product number 41827 (99% metal basis, 325 mesh powder);
First solvent: water
Second solvent: n-heptane
Third solvent: 1-butanol
Solvent-exfoliated $MoS_2$ flakes were produced from the above-mentioned commercial product, according to the method disclosed in ACS Energy Lett. 2017, 2, 524-531. The solvent-exfoliated $MoS_2$ flakes thus prepared have a thickness of 0.7 nm to 10 nm and a diameter of 50 nm to 2000 nm.
Flexible substrates: ITO coated PET from Solaronix product number PETITO188-18, a 188 μm thick PET film (polyethylene terephthalate) with a 18 Ω/sq indium tin oxide coating on one side Preparation Method 1) liquid-liquid interface of 10 cm by 10 cm was prepared by mixing 300 mL of water and 50 mL of n-heptane.
2) The solvent-exfoliated $MoS_2$ was dispersed in 1-butanol at a concentration of 1 mg/mL.
3) The solvent-exfoliated $MoS_2$ dispersion was injected into the liquid-liquid interface, using four injection points of blunt 20 gauge needles (Canaca Science 7932), at an injection rate of 0.5 mL/min.
4) When 2D flakes formed a complete film at liquid-liquid interface (after about 3 mL dispersion injection), injection was stopped and started the deposition with a 1 mm/min push rate and 1 mm/min withdraw rate. Here, the size of the individual flakes does not change during the deposition process. Therefore they have the same dimensions as in the dispersion.

Characterization

For the SEM picture included we used a commercial FTO from Solaronix product number TCO22-15. This is 2.2 mm thick and the FTO is on glass (not flexible).

The invention claimed is:

1. A method for preparing a semiconducting thin film comprising the following steps:
   (1) providing a liquid-liquid interface of a first solvent and a second solvent, wherein the first solvent is polar, and the second solvent is non-polar;
   (2) providing at least one layered semiconductor material or its precursor(s) in the form of particles in a third solvent in the form of a dispersion;
   (3) injecting the dispersion of step (2) at the liquid-liquid interface obtained in step (1), in order to obtain an assembly of semiconductor particles or semiconductor precursor particles at the liquid-liquid interface;
   (4) bringing the assembly of the semiconductor particles or the semiconductor precursor particles at the liquid-liquid interface obtained in step (3) into contact with a flexible substrate; and
   (5) applying a surface pressure to the assembly of the semiconductor particles or the semiconductor precursor particles in contact with the flexible substrate obtained in step (4), in order to obtain a particle film of semiconductor/semiconductor precursor on the substrate, wherein the first solvent has a higher density than the second solvent;
   wherein the first solvent and the second solvent are immiscible with each other and their densities are different by at least 0.01 g/mL; and
   wherein the third solvent is miscible at least with one of the first solvent or the second solvent.

2. The method according to claim 1, wherein the at least one layered semiconductor material is a transition metal dichalcogenide.

3. The method according to claim 2, wherein the transition metal-dichalcogenide is selected from the group consisting of $MoS_2$, $WS_2$, $MoSe_2$, $WSe_2$ and $MoTe_2$.

4. The method according to claim 1, wherein at least one layered semiconductor material or its precursor(s) are in the form of nanoflakes with a larger dimension in a direction perpendicular to a thickness direction of the nanoflakes than a dimension of the thickness direction of the nanoflakes.

5. The method according to claim 1, wherein the first solvent is selected from the group consisting of water, carboxylic acids, alcohols, ketones, organic sulfoxides, organic nitriles, amides and mixtures thereof.

6. The method according to claim 1, wherein the first solvent is selected from the group consisting of water, acetic acid, ethylene glycol, methanol, ethanol, n-propanol, n-butanol, acetone, ethyl acetate, dimethyl sulfoxide, acetonitrile, dimethylformamide (DMF), dimethylsulfoxide (DMSO) and mixtures thereof.

7. The method according to claim 1, wherein the second solvent is selected from the group consisting of linear and cyclic hydrocarbons, ethers and mixtures thereof.

8. The method according to claim 1, wherein the second solvent is selected form the group consisting of pentane, hexane, heptane, octane, benzene, diethyl ether and mixtures thereof.

9. The method according to claim 1, wherein the third solvent is selected from the group consisting of hexylamine, isopropanol, butanol, hexanol, water and mixtures thereof.

10. The method according to claim 1, wherein the third solvent is hexylamine, hexanol or tert-butanol or a mixture thereof.

11. The method according to claim 1, wherein either
   the first solvent is ethylene glycol, the second solvent is hexane, and the third solvent is hexylamine; or
   the first solvent is a water and acetonitrile mixture, the second solvent is pentane, and the third solvent is tert-butanol; or
   the first solvent is water, the second solvent is heptane, and the third solvent is n-butanol.

12. The method according to claim 1, wherein the substrate is selected from the group consisting of indium-doped tin oxide (ITO) and fluorine-doped tin oxide (FTO)-coated polyethyleneterephthalate (PET).

13. The method according to claim 12, wherein step (5) is carried out with a roll-to-roll deposition technique.

14. The method according to claim 1, wherein the method is carried out with a device comprising
   a container configured to contain the first and second solvents;
   an injection means configured to inject a predetermined volume of the dispersion at the liquid-liquid interface, the predetermined volume being determined at least in part by a particle size of the at least one layered semiconductor material; and
   a first support means at least partially submerged in the first liquid, wherein the first support means is configured to support at least a portion of the substrate.

* * * * *